US007715100B2

(12) United States Patent
Stallinga et al.

(10) Patent No.: US 7,715,100 B2
(45) Date of Patent: May 11, 2010

(54) METHOD AND APPARATUS FOR GENERATING RADICALLY AND/OR AZIMUTHALLY POLARIZED LIGHT BEAMS

(75) Inventors: Sjoerd Stallinga, Eindhoven (NL); Levinus Pieter Bakker, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 633 days.

(21) Appl. No.: 11/572,008

(22) PCT Filed: Jul. 11, 2005

(86) PCT No.: PCT/IB2005/052284

§ 371 (c)(1),
(2), (4) Date: Jan. 12, 2007

(87) PCT Pub. No.: WO2006/008691

PCT Pub. Date: Jan. 26, 2006

(65) Prior Publication Data

US 2009/0040610 A1    Feb. 12, 2009

(30) Foreign Application Priority Data

Jul. 16, 2004    (EP) ................... 04300446

(51) Int. Cl.
G02B 5/30    (2006.01)
G02B 27/28    (2006.01)
(52) U.S. Cl. ...................... 359/495; 359/900
(58) Field of Classification Search .............. 359/494, 359/495, 497, 500, 900
See application file for complete search history.

(56) References Cited

U.S. PATENT DOCUMENTS

| 5,150,234 | A | * | 9/1992 | Takahashi et al. | 349/1 |
| 5,410,375 | A | * | 4/1995 | Fiala | 351/168 |
| 5,555,129 | A | * | 9/1996 | Konno et al. | 359/569 |
| 6,081,377 | A | * | 6/2000 | Tomita | 359/495 |
| 6,108,131 | A | * | 8/2000 | Hansen et al. | 359/486 |
| 6,462,539 | B2 | * | 10/2002 | Moriya et al. | 324/244.1 |
| 6,683,710 | B2 | * | 1/2004 | Hoffman et al. | 359/256 |
| 6,693,711 | B1 | * | 2/2004 | Leger et al. | 356/369 |
| 6,714,351 | B2 | * | 3/2004 | Giordano et al. | 359/494 |
| 2002/0176166 | A1 | | 11/2002 | Schuster | |
| 2003/0234981 | A1 | | 12/2003 | Hoffman et al. | |

(Continued)

FOREIGN PATENT DOCUMENTS

EP    0501580    9/1992

OTHER PUBLICATIONS

Sjoerd Stallinga; "Axial Birefringence in High-Numeral-Aperture", Journal of the Optical Society of America, vol. 18, pp. 2846-2859, 2001.

(Continued)

*Primary Examiner*—Ricky D Shafer

(57) ABSTRACT

A method and an apparatus for generating a polarized light beam to be projected onto an object plane are provided. A converging or diverging light beam (18) is generated. The converging or diverging light beam is projected through a member (22, 52) comprising an uniaxial birefringent material, the uniaxial birefringent material having a symmetry axis essentially parallel to the optical axis (12) of the light beam, and the member being placed at a distance from the object plane. Thereby, it is possible to create, for example a radially polarized beam that can be used for various optical purposes, e.g. for optical data reading/writing or for microscopy.

9 Claims, 5 Drawing Sheets

U.S. PATENT DOCUMENTS

2004/0036971 A1    2/2004    McGuire, Jr.

OTHER PUBLICATIONS

CF. R Dorn et al; "Sharper Focus for a Radically Polarized Light Beam", Physical Review Letters, vol. 91, 2003.

Kikuta et al: "First-Order Aberration of a Double-Focus Lens", Journal of the Optical Society of America, vol. 9, No. 5, pp. 814-819, 1992.

IRS/Written Opinion of the International Searching Authority PCT/IB2005/052284 ; Dec. 2005.

* cited by examiner

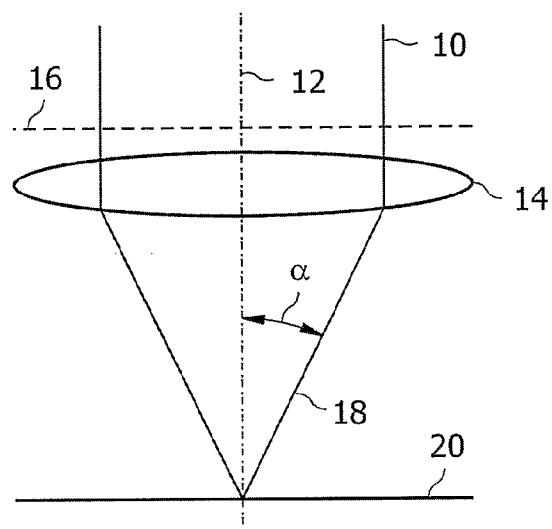
FIG.1
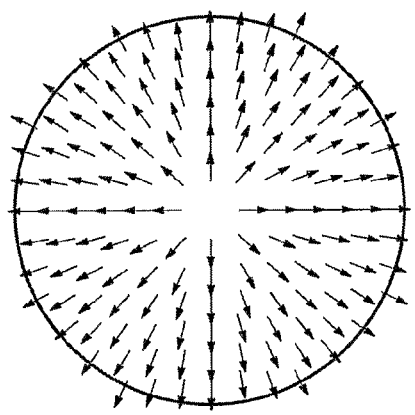      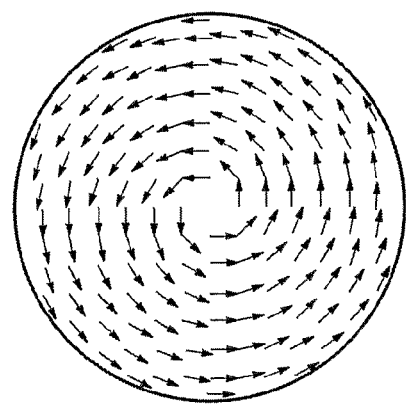
FIG.2A                FIG.2B

METHOD AND APPARATUS FOR GENERATING RADICALLY AND/OR AZIMUTHALLY POLARIZED LIGHT BEAMS

This application is a national stage application filed under 35 U.S.C. 371 of PCT/IB2005/052284 filed on Jul. 11, 2005.

FIELD OF THE INVENTION

The present invention relates to a method and an apparatus for generating radially and/or azimuthally polarized light beams. Particularly, the present invention relates to a method and an apparatus for generating a light beam having a relatively narrow focal spot on the basis of the mentioned polarization of the light beam.

BACKGROUND OF THE INVENTION

In many optical systems small details are to be resolved by a light beam. For example, in an optical disk drive the data is read out by focusing a beam of wavelength λ and numerical aperture NA onto the data layer and measuring the amount of light that is reflected back into the aperture of the lens. The same principle is applied in scanning microscopes. The smallest resolvable detail in these systems is of the order λ/NA. In conventional imaging systems, such as an optical lithography apparatus, the NA of the objective lens determines the resolution in much the same way as for a scanning microscope. For all these systems it holds that for small to moderate NA the polarization of the light beam does not play a very significant role. However, for large NA the polarization state is highly relevant for the resolving properties of the system. Conventionally, the polarization is taken to be uniform across the pupil of the system, and either linear or circular. A non-uniform polarization state alters the distribution of light close to the focal point. For example, a beam with a radially oriented linear polarization across the pupil is reported to result in a relatively narrow focal spot (cf. R. Dorn, S. Quabis, and G. Leuchs, Sharper focus for a radially polarized light beam, Physical Review Letters, Volume 91, 233901, 2003). When such a radially polarized beam is further modified by blocking the central part of the pupil (so-called apodization) the polarization state across the focal spot is substantially linear and oriented along the optical axis of the system. This stands in contrast to low NA imaging with a uniform linear polarization where the polarization state across the focal spot is substantially linear and oriented perpendicular to the optical axis. Thus, providing radially polarized light beams within an optical system allows for novel kinds of imaging.

According to prior art, radially polarized beams are difficult to produce. For example, it is required to modify the laser, or to introduce segmented wave plates and clean-up optical filters, or to use complicated computer generated diffractive elements.

An object of the present invention is to provide a light beam with a desired linear polarization across the pupil with simple means, and particularly with a radially oriented linear polarization across the pupil.

SUMMARY OF THE INVENTION

The above objects are solved by the features of the independent claims. Further developments and preferred embodiments of the invention are outlined in the dependent claims.

In accordance with the present invention, there is provided a method of generating a polarized light beam to be projected onto an object plane comprising the steps of: generating a converging or diverging light beam; and projecting the converging or diverging light beam through a member comprising a uniaxial birefringent material, the uniaxial birefringent material having a symmetry axis essentially parallel to the optical axis of the light beam, and the member being placed at a distance from the object plane.

Birefringent materials have a refractive index that depends on the polarization state of light. For example, when the polarization is along the symmetry axis of the uniaxially birefringent material, the refractive index is ne, and when the polarization is perpendicular to the symmetry axis, the refractive index is no, where no and ne are called the ordinary and extraordinary refractive index, respectively. When a beam of light travels at an angle q with the symmetry axis the polarized state perpendicular to the plane spanned by the propagation direction and the symmetry axis is referred to as the ordinary mode and has a refractive index no; the polarization state in the plane spanned by the propagation direction and the symmetry axis is referred to as the extraordinary mode and has a refractive index depending on the angle θ, namely $n_o n_e / \sqrt{n_o^2 \cos^2\theta + n_e^2 \sin^2\theta}$. The effect of focusing through/into a plan-parallel slab of uniaxial birefringent material, such that the symmetry axis of the birefringent slab is parallel to the optical axis is studied in S. Stalling a, Axial birefringence in high-numerical-aperture optical systems and the light distribution close to focus, Journal of the Optical Society of America A, Volume 18, 2846-2859, 2001. It appears that the extraordinary mode corresponds to the beam that is radially polarized in the pupil of the system, whereas the ordinary mode corresponds to the beam that is azimuthally polarized in the pupil of the system. Furthermore, these two beams are defocused with respect to each other, so that two separate foci occur, a distance dΔn/n from each other, where, in the case of a slab of uniform thickness, d is the thickness of the slab, Δn=ne−no is the birefringence, and n is the average refractive index.

Preferably, light that traveled through the uniaxial birefringent material comprises an extraordinary mode and an ordinary mode, the modes having different focal points, and a spatial filter is provided for substantially blocking one of these modes. When a plan-parallel slab is used as the object comprising a uniaxially birefringent material, both the extraordinary and the ordinary modes are generated by passing through the object. In the case that only one of these modes is to be used for optical data processing, it is advantageous, to filter out the other mode, thereby reducing the background in the resulting image.

According to a preferred embodiment, the ordinary mode is blocked by the spatial filter, thereby generating a radially polarized beam that passed the filter. Focusing of such a radially polarized beam results in a relatively narrow focal spot.

According to a further embodiment, the extraordinary mode is blocked by the spatial filter, thereby generating an azimuthally polarized beam that passed the filter, and the method frither comprises the step of: placing a π/2 rotator into the azimuthally polarized beam, thereby generating a radially polarized beam that passed the π/2 rotator. Thus, also in this case a radially polarized beam is obtained, leading to the mentioned advantages as to focusing.

In a further preferred embodiment, an apodizer is placed into a radially polarized beam. An apodizer blocks the central part of the pupil. Thereby, a polarization state across the focal spot is obtained that is substantially linear and oriented along the optical axis of the system.

When a plan-parallel slab is used as the member comprising a uniaxial birefringent material, the required thickness of this object depends on the desired separation between the two foci. The axial separation of the two foci is assumed to be much larger than the focal depth $n\lambda/NA^2$, i.e. $(d\Delta n/\lambda)(NA/n)^2 >> 1$. For $\lambda=405$ nm, NA=0.85, n=1.6, $\Delta n=0.15$ (typical for liquid crystalline materials), the thickness d must be much larger than about 10 μm, thus, a thickness of 50 μm will be sufficient.

A further embodiment of the method according to the invention comprises the steps of:

providing a member comprising a uniaxial birefringent material having a thickness d that varies with the angle of incidence θi according to $$d(\theta_i) = \frac{\lambda}{4} \cdot \frac{1}{\sqrt{n_o^2 - \sin^2\theta_i} - \frac{n_o}{n_e}\sqrt{n_e^2 - \sin^2\theta_i}},$$

wherein λ is the wavelength of the light, no is the refractive index for the ordinary mode, and ne is the refractive index for the extraordinary mode, and placing a π/4 rotator into the beam that passed the member, thereby generating a radially polarized beam that passed the π/4 rotator. According to this embodiment, the member is designed as a birefringent layer with a symmetry axis substantially parallel to the optical axis, irradiated by a converging or diverging beam of circularly polarized light, which introduces a retardation of a quarter wave length between the azimuthally polarized and the radially polarized component of the beam. Since the effective index of refraction is dependent on the angle of incidence θi, the thickness of the birefringent layer varies as a function of the angle as described above. The birefringent layer creates a linear polarization profile having an angle of 45 degrees with the radial direction for all rays in the converging or diverging cone of light. By guiding the beam through a rotator that rotates the polarization over 45 degrees, e.g. a slab of an optically active material, such as quartz, a radially polarized or azimuthally polarized beam is created. As compared to the embodiments of the present invention in which an extraordinary and an ordinary component are created and only one of these components is used, the solution discussed here has the advantage that no light is lost for the optical data processing.

In accordance with the present invention, there is further provided an apparatus for generating a polarized light beam to be projected onto an object plane comprising: means for generating a converging or diverging light beam; a member comprising a uniaxial birefringent material located in the converging or diverging light beam, the uniaxial birefringent material having a symmetry axis essentially parallel to the optical axis of the converging or diverging light beam, the member being further located at a distance from the object plane.

According to a still further aspect of the present invention, there is provided a member comprising a uniaxial birefringent material adapted to be placed into a converging or diverging light beam, the member having a thickness d that varies with the angle of incidence θi according to $$d(\theta_i) = \frac{\lambda}{4} \cdot \frac{1}{\sqrt{n_o^2 - \sin^2\theta_i} - \frac{n_o}{n_e}\sqrt{n_e^2 - \sin^2\theta_i}},$$

wherein λ is the wavelength of the light, no is the refractive index for the ordinary mode, and ne is the refractive index for the extraordinary mode.

The present invention further relates to an optical device comprising an apparatus according to the present invention.

These and other aspects of the invention will be apparent from and elucidated with reference to the embodiments described hereinafter.

BRIEF DESCRIPTION OF THE DRAWINGS

The invention will now be described in more detail by way of example with reference to the accompanying drawings, in which:

FIG. 1 shows an optical setup for defining basic terms to be used for explaining the present invention;

FIGS. 2a and 2b show cross sections through light beams in which radial and azimuthal polarizations are indicated, respectively;

DETAILED DESCRIPTION OF THE INVENTION

Figure 3:
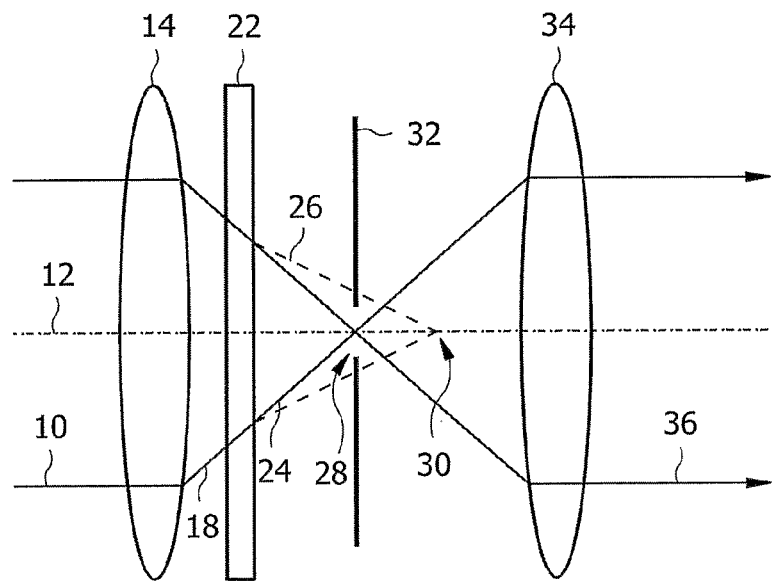
FIG. 3 shows an optical setup for illustrating the present invention.

FIG. 1 shows an optical setup for defining basic terms to be used for explaining the present invention. A light beam 10 travels parallel to an optical axis 12 and is incident on a lens 14 with a pupil plane 16. The lens 14 produces a converging light beam 18 with numerical aperture NA=nsinα, where α is the largest angle that the rays within the converging cone of light make with the optical axis 12, and where n is the refractive index of the medium that the beam is focused into. The converging beam of light is focused onto a layer 20, for example the data layer of an optical disk.

FIGS. 2a and 2b show cross sections through light beams in which radial and azimuthal polarizations are indicated, respectively. The cross sections are taken perpendicular to the optical axis of the light beams. An arrow at a certain point indicates the polarization for the ray at that point. Thus, FIG. 2a shows a radially polarized beam, and FIG. 2b shows an azimuthally polarized beam.

FIG. 3 shows an optical setup for illustrating the present invention. A light beam 10 travels parallel to an optical axis 12 and is incident on a first lens 14 of a telescope. The lens 14 generates a converging light beam 18 which passes through a uniaxial birefringent slab 22 having a symmetry axis parallel to the optical axis 12. This results into a splitting of the converging light beam 18 into the extraordinary light beam 24 and the ordinary light beam 26. The extraordinary light beam 24 has a first focal point 28, and the ordinary light beam 26 has a second focal point 30. A spatial filter 32 blocks the ordinary mode, and a second lens 34 of the telescope generates a parallel light beam 36. The spatial filter is realized as a pinhole. This parallel light beam 36 is an essentially radially polarized light beam.

Figure 4:
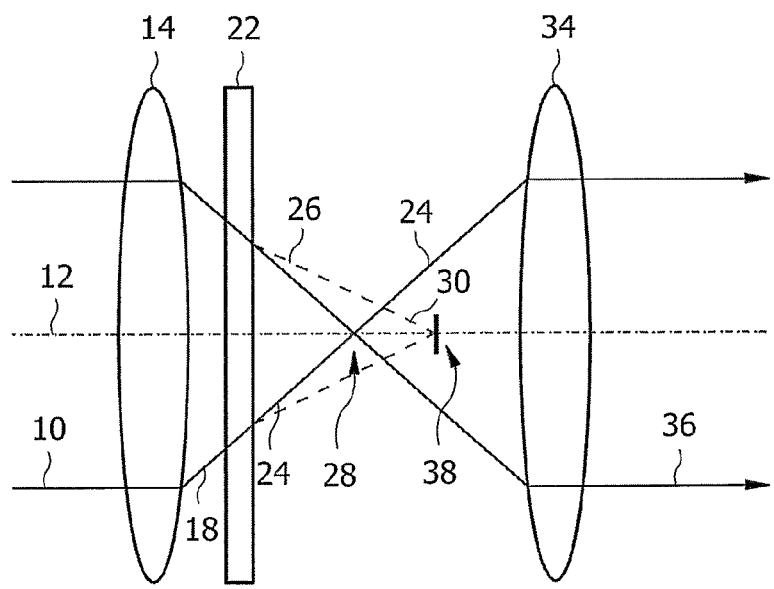
FIG. 4 shows a further optical setup for illustrating the present invention.

FIG. 4 shows a further optical setup for illustrating the present invention. The optical setup according to FIG. 4 largely corresponds to the optical setup shown in FIG. 3. In contrast to the setup according to FIG. 3, the spatial filter according to FIG. 4 is realized as a small obscuration 38 at the focus of the ordinary light beam 26. Thereby, besides blocking of the ordinary mode, also the central part, i.e. the rays close to the optical axis 12, of the extraordinary mode is blocked. Thus, the obscuration 38 also functions as an apodizer.

FIGS. 3 and 4 show embodiments in which the ordinary mode is blocked by the spatial filters 32 and 38, respectively. According to a further embodiment, the roles of the ordinary mode and the extraordinary mode are changed, i.e. the extraordinary mode is blocked and the ordinary mode passes the spatial filter. This implies that the beam directly after the telescope is azimuthally polarized. It is possible to transform this azimuthally polarized beam into a radially polarized beam by a uniform π/2 polarization rotator that is placed in the parallel beam directly after the telescope. Such a polarization rotator plate is for example a uniform slab of optically active material such as quartz of the thickness needed to produce the π/2 rotation.

Figure 5:
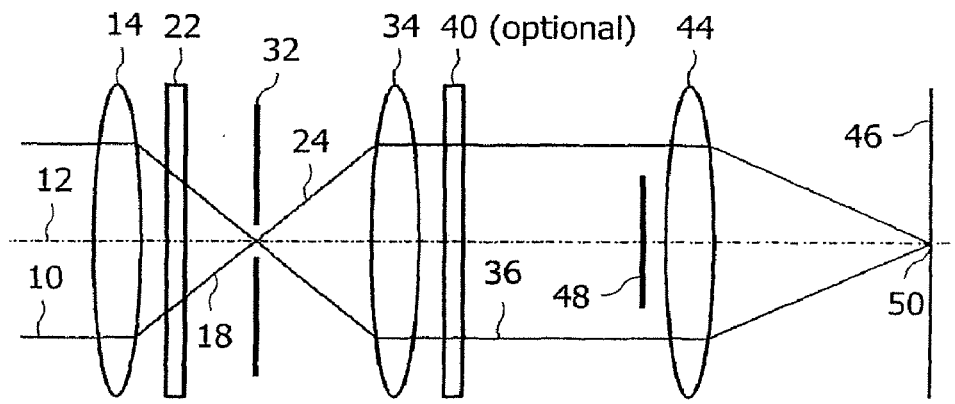
FIG. 5 shows an apparatus according to the present invention.

FIG. 5 shows an apparatus according to the present invention. The telescope used in the arrangement according to FIG. 5 corresponds to the telescope shown in FIG. 3. The parallel beam that leave the lens 34 is either radially or azimuthally polarized. In case that the beam is azimuthally polarized, a π/2 rotator 40 is placed into the parallel beam 36, thereby producing a radially polarized beam. This radially polarized beam is focused onto an object plane 46 by an objective lens 44. Possibly, an apodizer 48 is placed in front of the objective lens 44. The focus spot 50 thus produced results from a radially polarized beam and has a substantially linear polarization parallel to the optical axis 12.

According to a further embodiment that is not explicitly shown in the drawings, it is not required to use a spatial filter at all. Instead, the birefringent slab is placed into the converging beam directly after the objective lens of the high NA imaging system (optical disc read-out system, scanning microscope, etc.). Now the object is illuminated by both spots. The extraordinary spot is focused onto the data layer/relevant depth slice so that the ordinary spot is defocused. This causes a small, relatively uniform background in the resulting image, which is not so harmful for the extraction of data or the formation of a sharp image. However, if needed, the reflection due to the ordinary spot can be eliminated by means of a telescope with spatial filter placed in the detection branch of the optical disk readout system/scanning microscope, in much the same way as described according to the embodiments of the FIGS. 3, 4 and 5.

Figure 6:
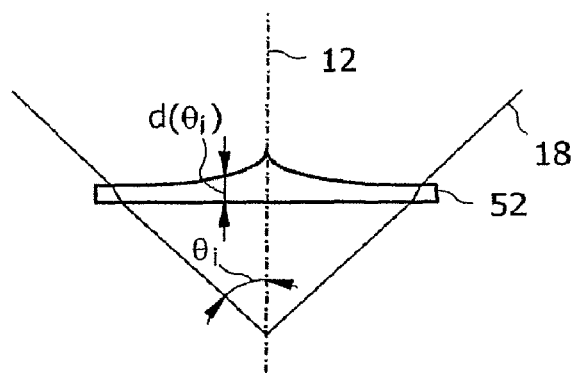
FIG. 6 shows an optical member according to one embodiment of the present invention.
Figure 7:
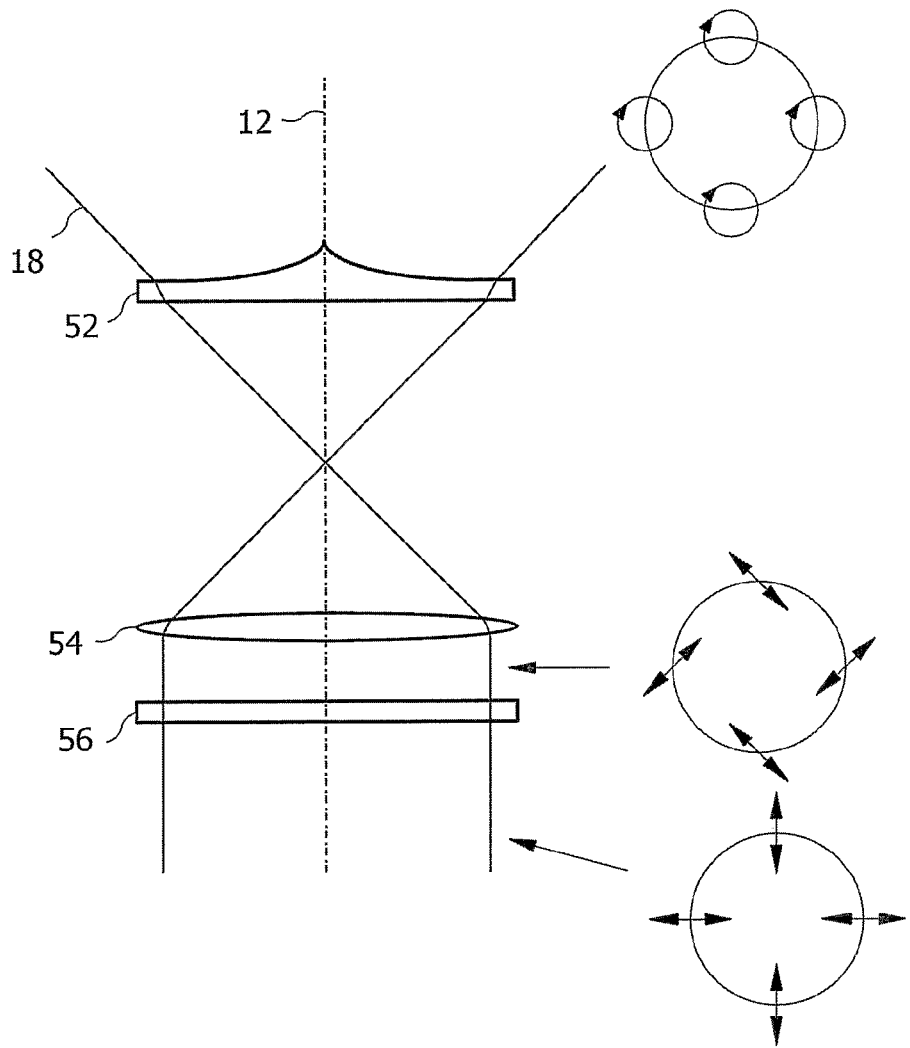
FIG. 7 shows an optical setup for illustrating the present invention.

FIG. 6 shows an optical member according to one embodiment of the present invention. FIG. 7 shows an optical setup for illustrating the present invention. According to the embodiments described so far, a plan-parallel slab of birefringent material is used. In any of the described embodiments, a part of the light is lost. According to the embodiment as shown in FIG. 6, a birefringent layer 52 with a symmetry axis substantially parallel to the optical axis is used that has a thickness varying with the angle of incidence θi. The optical axis 12 and the converging light beam 18 are also shown in FIG. 6. The thickness of the birefringent layer varies as a function of the angle of incidence according to $$d(\theta_i) = \frac{\lambda}{4} \cdot \frac{1}{\sqrt{n_o^2 - \sin^2\theta_i} - \frac{n_o}{n_e}\sqrt{n_e^2 - \sin^2\theta_i}},$$

wherein λ is the wavelength of the light, $n_o$ is the refractive index for the ordinary mode, and $n_e$ is the refractive index for the extraordinary mode.

In FIG. 7 the setup with the birefringent layer 52, a lens 54, and a π/4 rotator 56 is shown. If circularly polarized light is used for irradiating the birefringent layer 52, as shown in the top of FIG. 7, a linear polarization profile is created, as shown in the middle of FIG. 7. The linear polarization makes an angle of 45 degrees with the radial direction for all rays in the con-verging (or diverging) cone of light. By guiding the beam through a rotator that rotates the polarization over 45 degrees (for example a slab of an optical active material such as quartz), a radially polarized or azimuthally polarized beam is created. In the bottom of FIG. 7 a radially polarized beam is shown. The advantage of this solution is the fact that no light is lost.

It should be noted that this setup can also be realized by a solid immersion lens. Since the lens surface is perpendicular to the incoming rays, both the birefringent layer 52 and the rotator 56 can be "deposited" onto the spherical surface of the lens 54.

The birefringent material used according to the present invention can be a crystal-line medium such as quartz or $MgF_2$ or a liquid crystalline medium. The liquid crystalline medium is preferably a liquid crystalline polymer. In case of quartz used as the birefringent material, in order to compensate for the optical activity of quartz that manifests itself most prominently for the rays near the optical axis, the spatial filtering with an obscuration is preferred rather than the spatial filtering with a pinhole.

Figure 8:
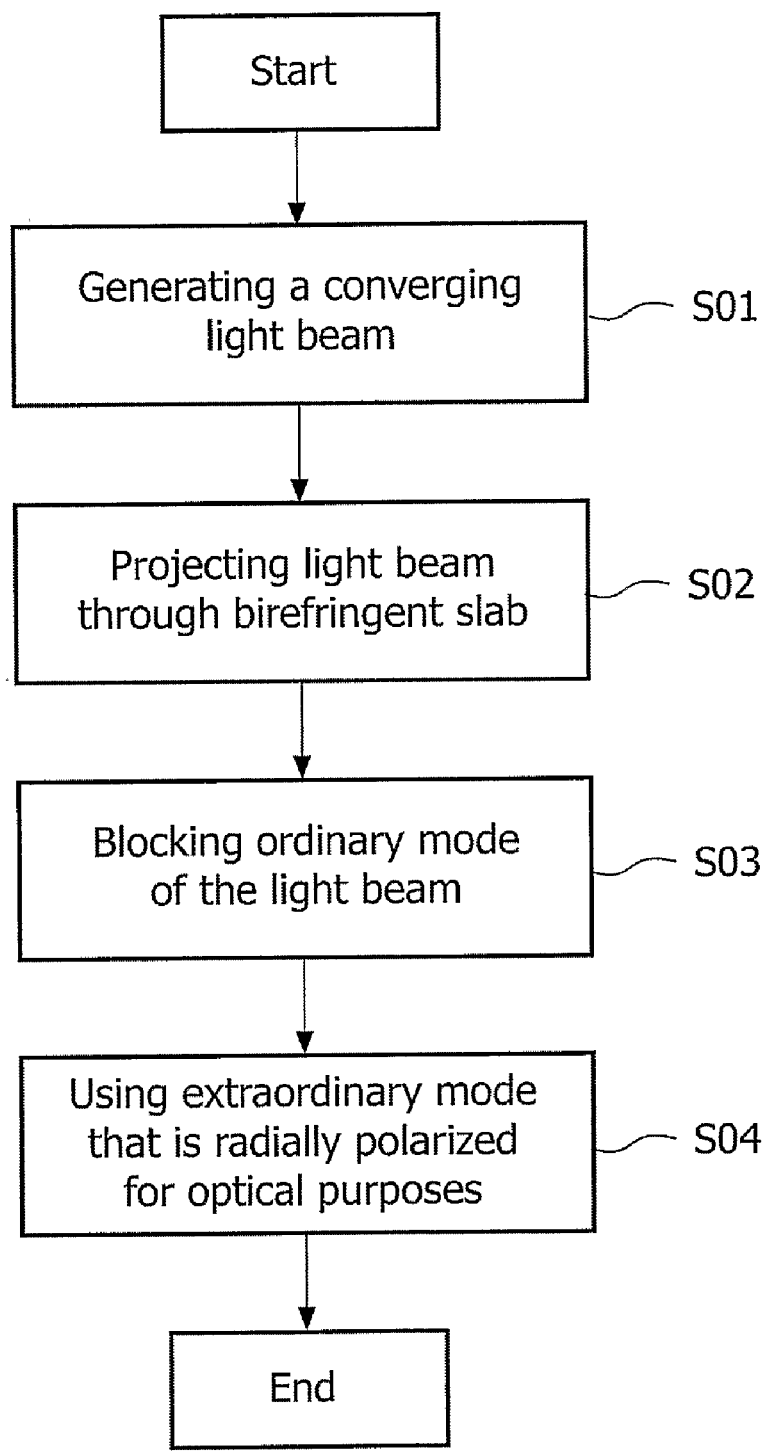
FIG. 8 shows a flow chart illustrating a method according to the present invention.

FIG. 8 shows a flow chart illustrating a method according to the present invention to be performed on the basis of e.g. the embodiment shown in FIG. 5. According to the embodiment described in FIG. 8, a converging light beam is generated (S01). The light beam is projected through a member comprising a uniaxial birefringent material having a symmetry axis essentially parallel to the optical axis of the light beam (S02). According to the embodiment presently discussed, an extraordinary and an ordinary mode is generated. In step S03 the ordinary mode is blocked. According to step S04, the extraordinary mode is used for optical purposes, for example for data read-out or confocal microscopy.

It is noted that the embodiments of the present invention can be different from the examples shown in the drawings and described above. For example, the birefringent material can also be placed into a diverging beam. In this case, the rest of the optical setup has to be adapted accordingly.

Equivalents and modifications not described above may also be employed without departing from the scope of the invention, which is defined in the accompanying claims.

Any reference sign in the following claims should not be construed as limiting the claim. It will be obvious that the use of the verb "to comprise" and its conjugations does not exclude the presence of any other elements besides those defined in any claim. The word "a" or "an" preceding an element does not exclude the presence of a plurality of such elements.

The invention claimed is:

1. A method of generating a polarized light beam to be projected onto an object plane (46) comprising the steps of:

generating a converging or diverging light beam (18);

projecting the converging or diverging light beam through a member (22, 52) comprising a uniaxial birefringent material, the uniaxial birefringent material having a symmetry axis essentially parallel to the optical axis (12) of the light beam, and the member being placed at a distance from the object plane, wherein light that traveled through the uniaxial birefringent material comprises an extraordinary mode (24) and an ordinary mode (26), the modes having different focal points (28, 30), characterized in that a spatial filter (32, 38) is provided for substantially blocking one of these modes.

2. The method according to claim 1, wherein the ordinary mode is blocked by the spatial filter, thereby generating a radially polarized beam that passed the filter.

3. The method according to claim 1, wherein the extraordinary mode is blocked by the spatial filter, thereby generating an azimuthally polarized beam that passed the filter, and further comprising the step of:

placing a π/2 rotator (40) into the azimuthally polarized beam, thereby generating a radially polarized beam that passed the π/2 rotator.

4. The method according to claim 1, wherein an apodizer (48) is placed into a radially polarized beam.

5. An apparatus for generating a polarized light beam to be projected onto an object plane (46) comprising:

means (14) for generating a converging or diverging light beam (18);

a member (22, 52) comprising a uniaxial birefringent material located in the converging or diverging light beam, the uniaxial birefringent material having a symmetry axis essentially parallel to the optical axis (12) of the converging or diverging light beam, the member being further located at a distance from the object plane, wherein the uniaxial birefringent material is adapted to separate the light beam into an extraordinary mode (24) and an ordinary mode (26), the modes having different focal points (28, 30), characterized in that a spatial filter (32, 38) is provided for substantially blocking one of these modes.

6. An optical device comprising an apparatus according to claim 5.

7. The apparatus according to claim 5, wherein the spatial filter is adapted for blocking the ordinary mode, thereby allowing a radially polarized beam to pass through the filter.

8. The apparatus according to claim 5, wherein the spatial filter is adapted for blocking the extraordinary mode, thereby allowing an azimuthally polarized beam to pass the filter, and further comprising a π/2 rotator (40) placed into the azimuthally polarized beam, thereby allowing a radially polarized beam to pass through the π/2 rotator.

9. The apparatus according to claim 5, wherein the spacial filter includes an apodizer (48) placed into a radially polarized beam.

* * * * *